United States Patent
Baek (10) Patent No.: US 8,890,583 B2
(45) Date of Patent: Nov. 18, 2014

(54) DATA TRANSMISSION CIRCUITS AND SYSTEM HAVING THE SAME

(71) Applicant: SK Hynix Inc., Icheon-si (KR)

(72) Inventor: Chang Ki Baek, Anyang-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/963,494

(22) Filed: Aug. 9, 2013

(65) Prior Publication Data

US 2014/0292390 A1    Oct. 2, 2014

(30) Foreign Application Priority Data

Apr. 2, 2013   (KR) .................... 10-2013-0035770

(51) Int. Cl.
 *H03K 3/00* (2006.01)
 *H03K 19/00* (2006.01)
(52) U.S. Cl.
 CPC .................................. *H03K 19/0005* (2013.01)
 USPC ........................... 327/112; 327/108; 327/170

(58) Field of Classification Search
 USPC .......................... 327/108–112, 170–172, 175
 See application file for complete search history.

(56) References Cited

U.S. PATENT DOCUMENTS

| 6,047,346 | A | 4/2000 | Lau et al. | |
| 8,018,246 | B2 * | 9/2011 | Kaiwa et al. | 326/30 |
| 8,228,104 | B2 * | 7/2012 | Yun et al. | 327/175 |
| 8,278,973 | B2 * | 10/2012 | Kuwahara et al. | 327/112 |

FOREIGN PATENT DOCUMENTS

KR   1020090074427 A   7/2009

* cited by examiner

*Primary Examiner* — An Luu
(74) *Attorney, Agent, or Firm* — William Park & Associates Patent Ltd.

(57) ABSTRACT

Data transmission circuits are provided. The data transmission circuit includes a control signal generator and an output driver. The control signal generator generates a pull-up control signal and a pull-down control signal by using a count signal that changes in response to a clock signal during a drive control period. The output driver receives an internal data signal and drives a transmission data signal in response to the pull-up control signal and the pull-down control signal.

20 Claims, 9 Drawing Sheets

DATA TRANSMISSION CIRCUITS AND SYSTEM HAVING THE SAME

CROSS-REFERENCE TO RELATED APPLICATION

The present application claims priority under 35 U.S.C. 119(a) to Korean Application No. 10-2013-0035770, filed on Apr. 2, 2013, in the Korean Intellectual Property Office, which is incorporated herein by reference in its entirety.

BACKGROUND

The current tendency in high-speed electronic systems is to transfer data between integration circuits included therein at high speed. Data signals transmitted between the integration circuits may be set to have small amplitudes in order to improve the data speed. Further, an output impedance of a data transmission circuit for transmitting the data signals should be matched with an impedance of a transmission line through which the data signals are transmitted so that the data signals having a small amplitude are not deformed or distorted. When the output impedance of the data transmission circuit is not matched with the impedance of the transmission line, the data signals may have abnormal waveforms due to overshoot or undershoot. In such a case, the data signals may not be transmitted at a high speed.

On-die termination (ODT) is the technology where the termination resistor for impedance matching in the transmission lines is located inside a semiconductor device instead of on a printed circuit board. An ODT circuit may include a switching circuit to reduce power consumption. However, the impedance of the ODT circuits may vary according to process/voltage/temperature (PVT) conditions. Hence, a test for calibrating the impedance of the ODT circuits may be required prior to use of the ODT circuits.

The impedance calibration test may be executed using a ZQ calibration circuit. The data transmission circuit may generate a code signal for calibrating a pull-up drive or a pull-down drive using a ZQ resistor connected to an external device and may calibrate the impedance of the ODT circuit using the code signal, thereby executing the impedance calibration test.

SUMMARY

Various embodiments are directed to data transmission circuits.

According to various embodiments, a data transmission circuit includes a control signal generator and an output driver. The control signal generator generates a pull-up control signal and a pull-down control signal by using a count signal that changes in response to a clock signal during a drive control period. The output driver receives an internal data signal and drives a transmission data signal in response to the pull-up control signal and the pull-down control signal.

According to various embodiments, a data transmission circuit includes a count signal generator and a signal converter. The count signal generator is driven in response to an activation signal which is enabled during the drive control period to generate first and second count signals by performing counting operations under a control a clock signal. The signal converter outputs first and second pull-up control signals for controlling a pull-up drive of a transmission data signal by buffering opposite logic levels to the first and second count signals and outputs first and second pull-down control signals for controlling a pull-down drive of the transmission data signal by buffering the first and second count signals.

According to an embodiment, a system includes a data transmission circuit. The data transmission circuit includes a control signal generator configured to generate a plurality of count signals in response to an activation signal; and an output driver configured to receive an internal data signal and drive a transmission data signal in response to a plurality of pull-up control signals and a plurality of pull-down control signals.

BRIEF DESCRIPTION OF THE DRAWINGS

Embodiments of the inventive concept will become more apparent in view of the attached drawings and accompanying detailed description, in which.

DETAILED DESCRIPTION

Example embodiments of the inventive concept will be described hereinafter with reference to the accompanying drawings. However, the example embodiments described herein are for illustrative purposes only and are not intended to limit the scope of the inventive concept.

Figure 1:
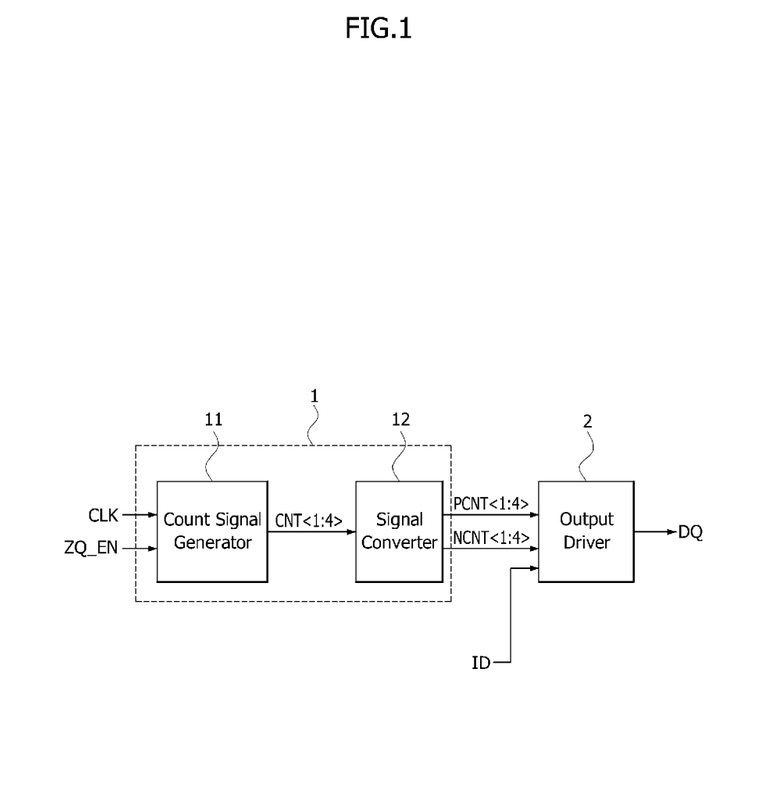
FIG. 1 is a block diagram illustrating a configuration of a data transmission circuit according to an embodiment of the present invention.

Referring to FIG. 1, a data transmission circuit according to an embodiment of the present invention may be configured to include a control signal generator 1 and an output driver 2. The control signal generator 1 may include a count signal generator 11 and a signal converter 12. The count signal generator 11 may be driven in response to an activation signal ZQ_EN which is enabled during a drive control period and may generate first to fourth count signals CNT<1:4>. In an embodiment of the present invention, the first to fourth count signals CNT<1:4> may be generated by performing counting operations under control of a clock signal CLK. The signal converter 12 may generate first to fourth pull-up control signals PCNT<1:4> for controlling a pull-up driving force of a transmission data signal DQ and output first to fourth pull-down control signals NCNT<1:4> for controlling a pull-down driving force of the transmission data signal DQ in response to the first to fourth count signals CNT<1:4>. For example, the signal converter 12 may generate the first to fourth pull-down control signals NCNT<1:4> by buffering and outputting the first to fourth count signals CNT<1:4>. For example, the signal converter 12 may also generate the first to fourth pull-up control signals PCNT<1:4> by buffering and outputting opposite logic-levels to the first to fourth count signals CNT<1:4>. The output driver 2 may receive an internal data signal ID and may drive the transmission data signal DQ in response to the first to fourth pull-up control signals PCNT<1:4> and the first to fourth pull-down control signals NCNT<1:4>. The drive control period may be set to a period when an impedance calibration test is being carried out, but not limited thereto.

Figure 2:
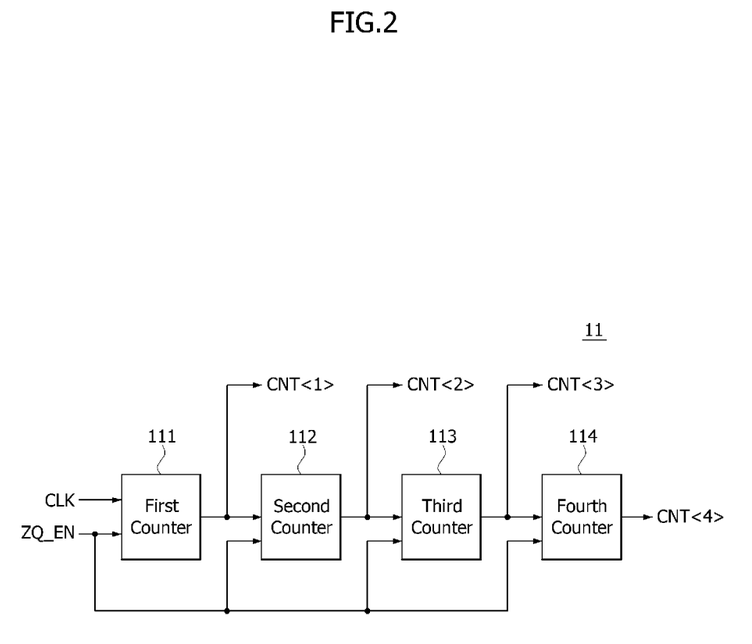
FIG. 2 is a block diagram illustrating an example of a count signal generator included in the data transmission circuit of FIG. 1.

Referring to FIG. 2, the count signal generator 11 may be configured to include a first counter 111, a second counter 112, a third counter 113 and a fourth counter 114. The first counter 111 may output the first count signal CNT<1> by operating at every clock pulse of the clock signal CLK during the drive control period that the activation signal ZQ_EN is enabled to have a logic "high" level. The first count signal CNT<1> may be obtained by dividing the frequency of the clock signal CLK by 2. The second counter 112 may output the second count signal CNT<2> by operating at every clock pulse of the first count signal CNT<1> during the drive control period that the activation signal ZQ_EN is enabled to have a logic "high" level. The second count signal CNT<2> may be obtained by dividing the frequency of the clock signal CLK by 4. The third counter 113 may output the third count signal CNT<3> by operating at every clock pulse of the second count signal CNT<2> during the drive control period that the activation signal ZQ_EN is enabled to have a logic "high" level. The third count signal CNT<3> may be obtained by dividing the frequency of the clock signal CLK by 8. The fourth counter 114 may output the fourth count signal CNT<4> by operating at every clock pulse of the third count signal CNT<3> during the drive control period that the activation signal ZQ_EN is enabled to have a logic "high" level. The fourth count signal CNT<4> may be obtained by dividing the frequency of the clock signal CLK by 16. If a frequency of the clock signal CLK increases, frequencies of the first to fourth count signals CNT<1:4> generated in the count signal generator 11 may also increase.

Figure 3:
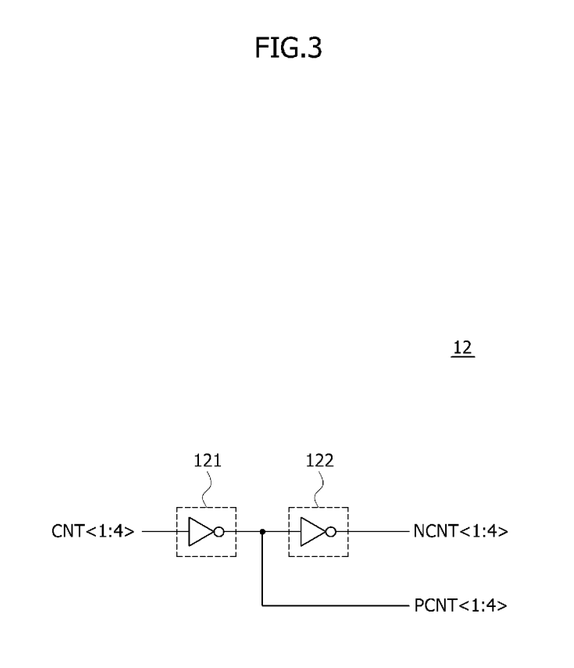
FIG. 3 is a circuit diagram illustrating an example of a signal converter included in the data transmission circuit of FIG. 1.

Referring to FIG. 3, the signal converter 12 may be configured to include a first buffer 121 and a second buffer 122. The first buffer 121 may generate the first to fourth pull-up control signals PCNT<1:4> by buffering and outputting opposite logic-levels to the first to fourth count signals CNT<1:4>. The second buffer 122 may generate the first to fourth pull-down control signals NCNT<1:4> by buffering and outputting opposite logic-levels to the first to fourth pull-up control signals PCNT<1:4>.

Figure 4:
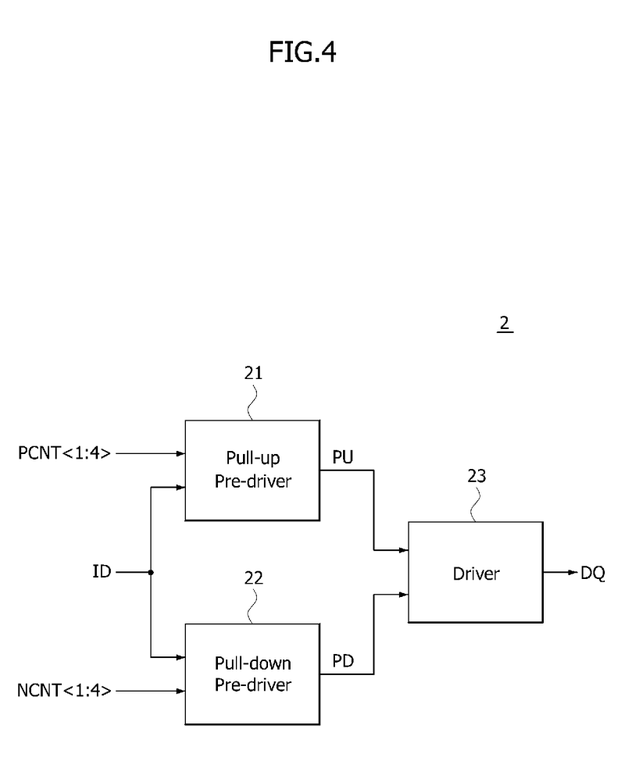
FIG. 4 is a block diagram illustrating an example of an output driver included in the data transmission circuit of FIG. 1.

Referring to FIG. 4, the output driver 2 may be configured to include a pull-up pre-driver 21, a pull-down pre-driver 22 and a driver 23. The pull-up pre-driver 21 may receive the internal data signal ID to output a pull-up signal PU driven by a drivability which is set according to the first to fourth pull-up control signals PCNT<1:4>. The pull-down pre-driver 22 may receive the internal data signal ID to output a pull-down signal PD driven by a drivability which is set according to the first to fourth pull-down control signals NCNT<1:4>. The driver 23 may output the transmission data signal DQ which is driven in response to the pull-up signal PU and the pull-down signal PD.

Figure 5:
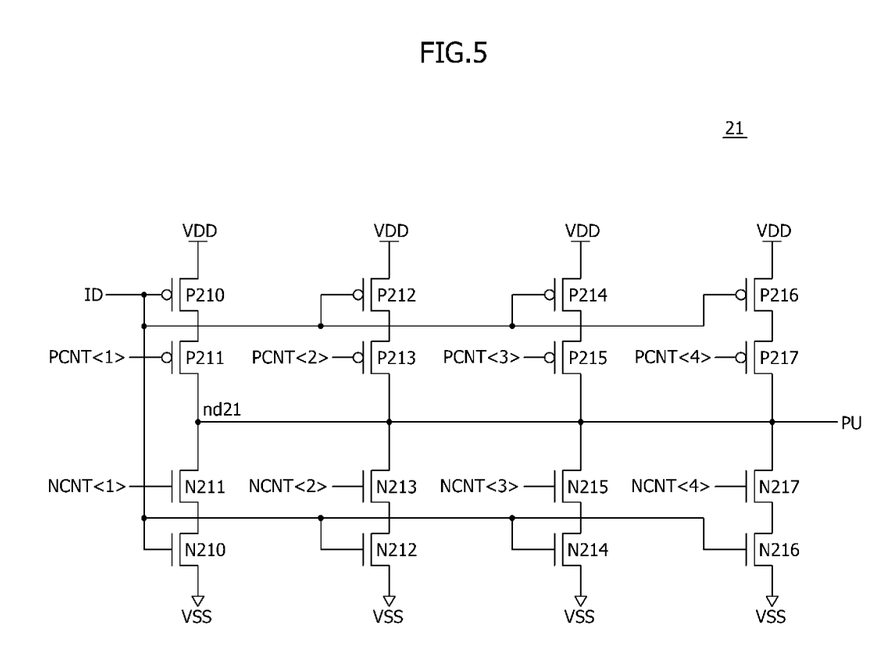
FIG. 5 is a circuit diagram illustrating an example of a pull-up pre-driver included in the output driver of FIG. 4.

Referring to FIG. 5, the pull-up pre-driver 21 may be configured to include first to fourth pull-up elements P210, P212, P214 and P216, first to fourth pull-up switches P211, P213, P215 and P217, first to fourth pull-down elements N210, N212, N214 and N216, and first to fourth pull-down switches N211, N213, N215 and N217. In an embodiment of the present invention, the first to fourth pull-up elements P210, P212, P214 and P216 and the first to fourth pull-up switches P211, P213, P215 and P217 may be PMOS transistors, and the first to fourth pull-down elements N210, N212, N214 and N216 and the first to fourth pull-down switches N211, N213, N215 and N217 may be NMOS transistors.

The first to fourth pull-up elements P210, P212, P214 and P216 may be turned on to pull up the pull-up signal PU outputted from a first node ND21 when the internal data signal ID has a logic "low" level. The first to fourth pull-up switches P211, P213, P215 and P217 may be respectively connected in series to the first to fourth pull-up elements P210, P212, P214 and P216 between a power supply terminal VDD and the first node ND21. Further, the first to fourth pull-up switches P211, P213, P215 and P217 may be turned on in response to the first to fourth pull-up control signals PCNT<1:4> having a logic "low" level, respectively. The first to fourth pull-down elements N210, N212, N214 and N216 may be turned on to pull down the pull-up signal PU when the internal data signal ID has a logic "high" level. The first to fourth pull-down switches N211, N213, N215 and N217 may be respectively connected in series to the first to fourth pull-down elements N210, N212, N214 and N216 between the first node ND21 and a ground voltage terminal VSS. Further, the first to fourth pull-down switches N211, N213, N215 and N217 may be turned on in response to the first to fourth pull-down control signals NCNT<1:4> having a logic "high" level, respectively. As described above, the first to fourth pull-up control signals PCNT<1:4> and the first to fourth pull-down control signals NCNT<1:4> may be generated by buffering the first to fourth count signals CNT<1:4>. Thus, if frequencies of the first to fourth count signals CNT<1:4> increase, the number of enabled signals among the pull-up control signals PCNT<1:4> and the pull-down control signals NCNT<1:4> may also increase. In the event that the number of enabled signals among the pull-up control signals PCNT<1:4> and the pull-down control signals NCNT<1:4> increases, the number of turned-on switches among the pull-up switches P211, P213, P215 and P217 and the pull-down switches N211, N213, N215 and N217 may also increase to enhance a drivability for driving the pull-up signal PU.

Figure 6:
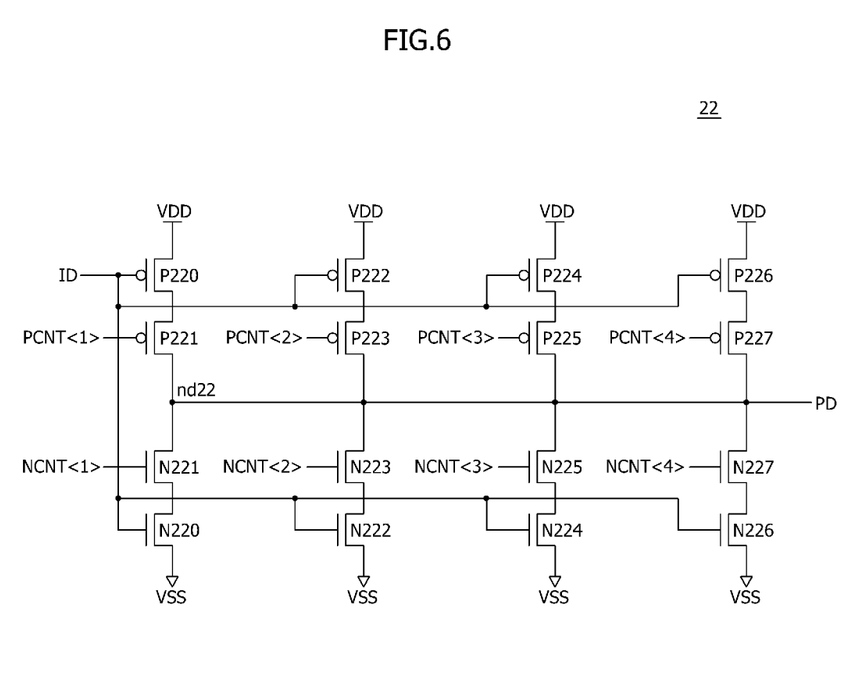
FIG. 6 is a circuit diagram illustrating an example of a pull-down pre-driver included in the output driver of FIG. 4.

Referring to FIG. 6, the pull-down pre-driver 22 may be configured to include fifth to eighth pull-up elements P220, P222, P224 and P226, fifth to eighth pull-up switches P221, P223, P225 and P227, fifth to eighth pull-down elements N220, N222, N224 and N226, and fifth to eighth pull-down switches N221, N223, N225 and N227. In an embodiment of the present invention, the fifth to eighth pull-up elements P220, P222, P224 and P226 and the fifth to eighth pull-up switches P221, P223, P225 and P227 may be PMOS transistors, and the fifth to eighth pull-down elements N220, N222, N224 and N226 and the fifth to eighth pull-down switches N221, N223, N225 and N227 may be NMOS transistors.

The fifth to eighth pull-up elements P220, P222, P224 and P226 may be turned on to pull up the pull-down signal PD outputted from a second node ND22 when the internal data signal ID has a logic "low" level. The fifth to eighth pull-up switches P221, P223, P225 and P227 may be respectively connected in series to the fifth to eighth pull-up elements P220, P222, P224 and P226 between the power supply terminal VDD and the second node ND22. Further, the fifth to eighth pull-up switches P221, P223, P225 and P227 may be turned on in response to the first to fourth pull-up control signals PCNT<1:4> having a logic "low" level, respectively. The fifth to eighth pull-down elements N220, N222, N224 and N226 may be turned on to pull down the pull-down signal PD when the internal data signal ID has a logic "high" level. The fifth to eighth pull-down switches N221, N223, N225 and N227 may be respectively connected in series to the fifth to eighth pull-down elements N220, N222, N224 and N226 between the second node ND22 and the ground voltage terminal VSS. Further, the fifth to eighth pull-down switches N221, N223, N225 and N227 may be turned on in response to the first to fourth pull-down control signals NCNT<1:4> having a logic "high" level, respectively. As described above, the first to fourth pull-up control signals PCNT<1:4> and the first to fourth pull-down control signals NCNT<1:4> may be generated by buffering the first to fourth count signals CNT<1:4>. Thus, if frequencies of the first to fourth count signals CNT<1:4> increase, the number of enabled signals among the pull-up control signals PCNT<1:4> and the pull-down control signals NCNT<1:4> may also increase. In the event that the number of enabled signals among the pull-up control signals PCNT<1:4> and the pull-down control signals NCNT<1:4> increases, the number of turned-on switches among the pull-up switches P221, P223, P225 and P227 and the pull-down switches N221, N223, N225 and N227 may also increase to enhance a drivability for driving the pull-down signal PD.

Figure 7:
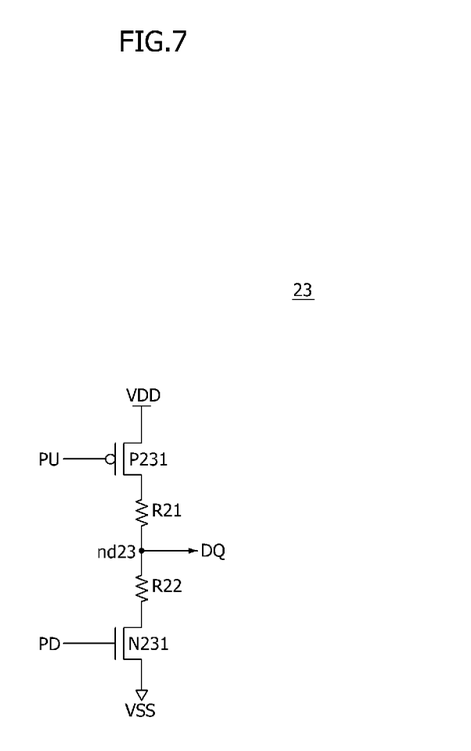
FIG. 7 is a circuit diagram illustrating an example of a driver included in the output driver of FIG. 4.

Referring to FIG. 7, the driver 23 may configured to include a PMOS transistor P231, a resistor R21, a resistor R22 and an NMOS transistor N231. The PMOS transistor P231 and a resistor R21 are connected in series between the power supply terminal VDD and a third node ND23. The resistor R22 and an NMOS transistor N231 are connected in series between the third node ND23 and the ground voltage terminal VSS. The PMOS transistor P231 may be turned on in response to the pull-up signal PU to pull up the transmission data signal DQ, and the NMOS transistor N231 may be turned on in response to the pull-down signal PD to pull down the transmission data signal DQ. If a drivability of the pull-up pre-driver 21 for driving the pull-up signal PU and a drivability of the pull-down pre-driver 22 for driving the pull-down signal PD increase, the driver 23 may drive the transmission data signal DQ more quickly to increase a slew rate of the transmission data signal DQ.

Operations of the data transmission circuit as set forth above will be described with reference to FIGS. 8 and 9 in conjunction with an example that a frequency of the clock signal CLK is relatively high and an example that a frequency of the clock signal CLK is relatively low.

Figure 8:
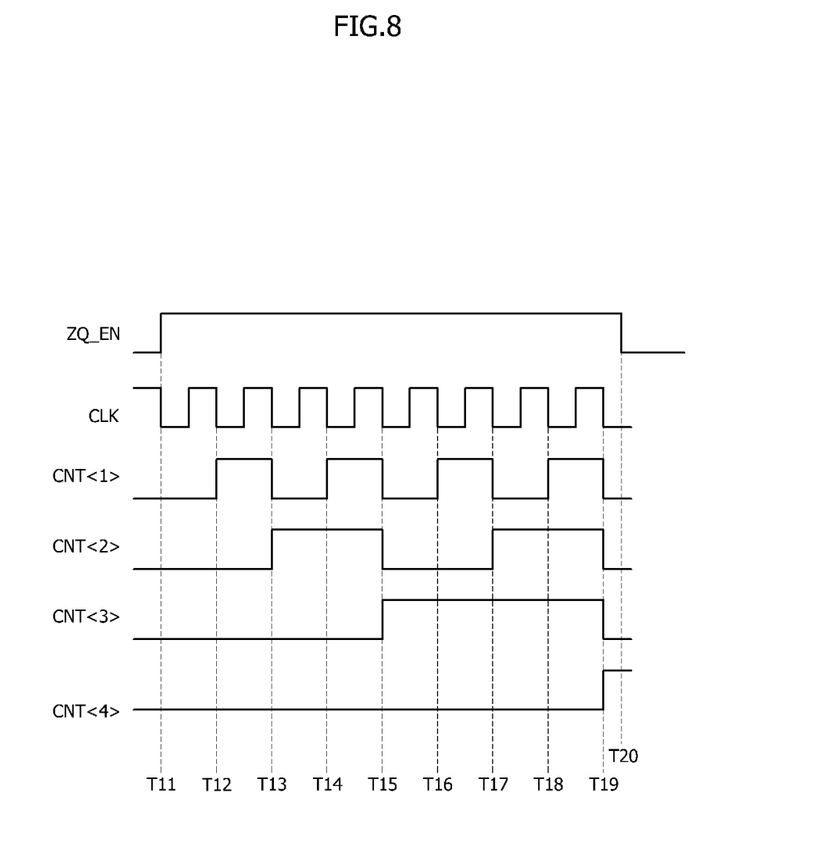
FIGS. 8 and 9 are timing diagrams illustrating operations of data transmission circuits according to an embodiment of the present invention.

As illustrated in FIG. 8, if the frequency of the clock signal CLK is relatively high, the number of times that the clock signal CLK is toggled may increase during the drive control period (from a point of time T11 to a point of time T20) when the activation signal ZQ_EN is enabled to have a logic "high" level. In an embodiment of the present invention, if a first pulse of the clock signal CLK is applied to the count signal generator 11 of the control signal generator 1 at a point of time T12, the first to fourth count signals CNT<1:4> may have a logic "high(H)" level, a logic "low(L)" level, a logic "low(L)" level and a logic "low(L)" level, respectively. If a second pulse of the clock signal CLK is applied to the count signal generator 11 of the control signal generator 1 at a point of time T13, the first to fourth count signals CNT<1:4> may have a logic "low(L)" level, a logic "high(H)" level, a logic "low(L)" level and a logic "low(L)" level, respectively. If a third pulse of the clock signal CLK is applied to the count signal generator 11 of the control signal generator 1 at a point of time T14, the first to fourth count signals CNT<1:4> may have a logic "high(H)" level, a logic "high(H)" level, a logic "low(L)" level and a logic "low(L)" level, respectively. If a fourth pulse of the clock signal CLK is applied to the count signal generator 11 of the control signal generator 1 at a point of time T15, the first to fourth count signals CNT<1:4> may have a logic "low(L)" level, a logic "low(L)" level, a logic "high(H)" level and a logic "low(L)" level, respectively. If a fifth pulse of the clock signal CLK is applied to the count signal generator 11 of the control signal generator 1 at a point of time T16, the first to fourth count signals CNT<1:4> may have a logic "high (H)" level, a logic "low(L)" level, a logic "high(H)" level and a logic "low(L)" level, respectively. If a sixth pulse of the clock signal CLK is applied to the count signal generator 11 of the control signal generator 1 at a point of time T17, the first to fourth count signals CNT<1:4> may have a logic "low(L)" level, a logic "high(H)" level, a logic "high(H)" level and a logic "low(L)" level, respectively. If a seventh pulse of the clock signal CLK is applied to the count signal generator 11 of the control signal generator 1 at a point of time T18, the first to fourth count signals CNT<1:4> may have a logic "high (H)" level, a logic "high(H)" level, a logic "high(H)" level and a logic "low(L)" level, respectively. If an eighth pulse of the clock signal CLK is applied to the count signal generator 11 of the control signal generator 1 at a point of time T19, the first to fourth count signals CNT<1:4> may have a logic "low(L)" level, a logic "low(L)" level, a logic "low(L)" level and a logic "high(H)" level, respectively. Since eight pulses of the clock signal CLK are sequentially applied to the count signal generator 11 during the drive control period (T11~T20), a combination of the first to fourth count signals CNT<1:4> may have eight different values in this period.

Figure 9:
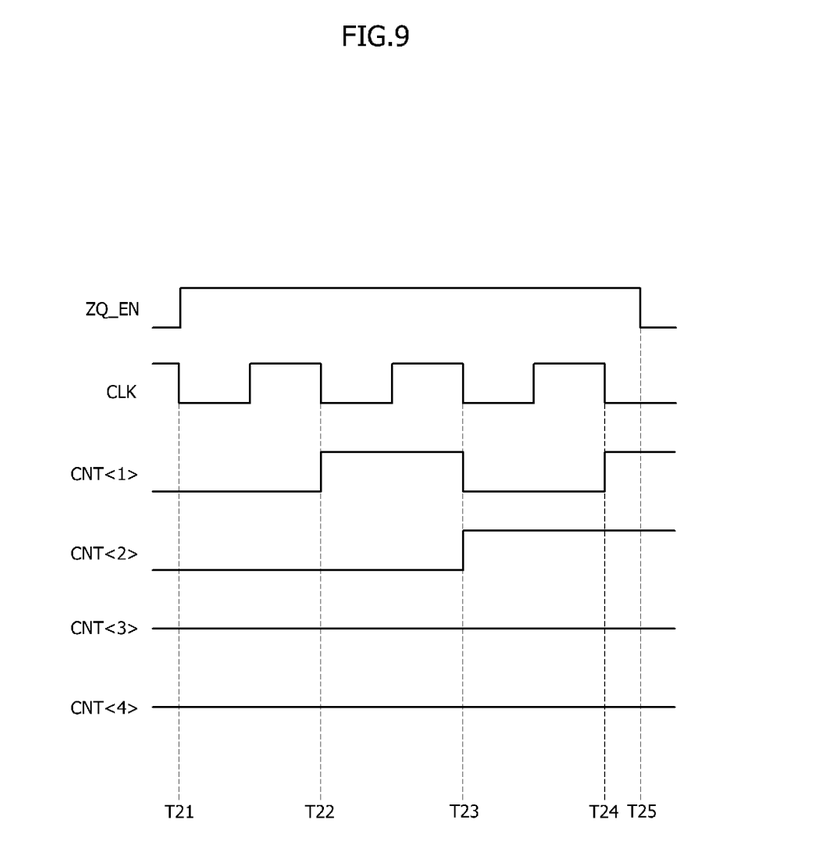

Referring to FIG. 9, if the frequency of the clock signal CLK is relatively low, the number of times that the clock signal CLK is toggled may decrease during the drive control period (from a point of time T21 to a point of time T25) when the activation signal ZQ_EN is enabled to have a logic "high" level. In an embodiment of the present invention, if a first pulse of the clock signal CLK is applied to the count signal generator 11 of the control signal generator 1 at a point of time T22, the first to fourth count signals CNT<1:4> may have a logic "high(H)" level, a logic "low(L)" level, a logic "low(L)" level and a logic "low(L)" level, respectively. If a second pulse of the clock signal CLK is applied to the count signal generator 11 of the control signal generator 1 at a point of time T23, the first to fourth count signals CNT<1:4> may have a logic "low(L)" level, a logic "high(H)" level, a logic "low(L)" level and a logic "low(L)" level, respectively. If a third pulse of the clock signal CLK is applied to the count signal generator 11 of the control signal generator 1 at a point of time T24, the first to fourth count signals CNT<1:4> may have a logic "high(H)" level, a logic "high(H)" level, a logic "low(L)" level and a logic "low(L)" level, respectively. Since three pulses of the clock signal CLK are sequentially applied to the count signal generator 11 during the drive control period (T21-T25), the first to fourth count signals CNT<1:4> may have three different values in this period.

As a result, in the data transmission circuit according to an embodiment of the present invention, the number of values that the combination of the first to fourth count signals CNT<1:4> may have during a specific period may increase as the frequency of the clock signal CLK becomes higher. If the number of values that the combination of the first to fourth count signals CNT<1:4> may have during the specific period increases, the drivability for driving the pull-up signal PU and the pull-down signal PD may also increase to improve a slew rate of the transmission data signal DQ. That is, the data transmission circuit according to an embodiment of the present invention may transmit a transmission data signal having a high slew rate when the frequency of the clock signal CLK becomes higher. The data transmission circuit according to an embodiment of the present invention may transmit a transmission data signal having a low slew rate when the frequency of the clock signal CLK becomes lower.

According to an embodiment of the present invention set forth above, a drivability for driving a transmission data signal may be controlled by a frequency of an external clock signal. Thus, a slew rate of the transmission data signal can be controlled according to the frequency of the external clock signal.

The example embodiments of the inventive concept have been disclosed above for illustrative purposes. Those skilled in the art will appreciate that various modifications, additions and substitutions are possible, without departing from the scope and spirit of the inventive concept as disclosed in the accompanying claims.

What is claimed is:

1. A data transmission circuit comprising:
   a control signal generator configured to generate a pull-up control signal and a pull-down control signal by using a count signal that changes in response to a clock signal during a drive control period; and
   an output driver configured to receive an internal data signal and to drive a transmission data signal in response to the pull-up control signal and the pull-down control signal,
   wherein the drive control period may be set to a period when an impedance calibration test is being carried out.

2. The data transmission circuit of claim 1, wherein a frequency of the count signal varies according to a frequency of the clock signal.

3. The data transmission circuit of claim 2, wherein the frequency of the count signal increases as the frequency of the clock signal increases.

4. The data transmission circuit of claim 1, wherein the count signal include a first count signal and a second count signal, the pull-up control signal includes a first pull-up control signal and a second pull-up control signal, and the pull-down control signal includes a first pull-down control signal and a second pull-down control signal, and wherein the control signal generator includes:
   a count signal generator configured to be driven in response to an activation signal which is enabled during the drive control period to generate the first and second count signals by performing counting operations under control of the clock signal; and
   a signal converter configured to output the first and second pull-up control signals by buffering opposite logic-levels to the first and second count signals and output the first and second pull-down control signals by buffering the first and second count signals.

5. The data transmission circuit of claim 4, wherein the count signal generator includes:
   a first counter configured to receive the activation signal to output the first count signal generated in response to the clock signal; and
   a second counter configured to receive the activation signal to output the second count signal generated in response to the first count signal.

6. The data transmission circuit of claim 5, wherein the first count signal is obtained by dividing the frequency of the clock signal by two, and wherein the second count signal is obtained by dividing the frequency of the clock signal by four.

7. The data transmission circuit of claim 4, wherein the signal converter includes:
   a first buffer configured to buffer opposite logic-levels to the first and second count signals to generate the first and second pull-up control signals; and
   a second buffer configured to buffer opposite logic-levels to the first and second pull-up control signals to generate the first and second pull-down control signals.

8. The data transmission circuit of claim 1, wherein the output driver includes:
   a pull-up pre-driver configured to drive a pull-up signal in response to the pull-up control signal and the internal data signal; and
   a pull-down pre-driver configured to drive a pull-down signal in response to the pull-down control signal and the internal data signal; and
   a driver configured to drive the transmission data signal in response to the pull-up signal and the pull-down signal.

9. The data transmission circuit of claim 8, wherein a drivability of the pull-up pre-driver for driving the pull-up signal increases when a frequency of the pull-up control signal increases.

10. The data transmission circuit of claim 9, wherein a drivability of the pull-down pre-driver for driving the pull-down signal increases when a frequency of the pull-down control signal increases.

11. The data transmission circuit of claim 10, wherein the pull-up pre-driver includes:
    a first pull-up element and a first pull-up switch coupled in series between a power supply terminal and a first node; and
    a first pull-down switch and a first pull-down element coupled in series between the first node and a ground voltage terminal,
    wherein the first pull-up switch is turned on in response to the pull-up control signal, the first pull-down switch is turned on in response to the pull-down control signal, and the first pull-up element and the first pull-down element are turned on in response to the internal data signal.

12. The data transmission circuit of claim 11, wherein the pull-down pre-driver includes:
    a second pull-up element and a second pull-up switch coupled in series between the power supply terminal and a second node; and
    a second pull-down switch and a second pull-down element coupled in series between the second node and a ground voltage terminal,
    wherein the second pull-up switch is turned on in response to the pull-up control signal, the second pull-down switch is turned on in response to the pull-down control signal, and the second pull-up element and the second pull-down element are turned on in response to the internal data signal.

13. The data transmission circuit of claim 12, wherein the driver includes:
    a pull-up element configured to pull-up the transmission data signal in response to the pull-up signal; and
    a pull-down element configured to pull-down the transmission data signal in response to the pull-down signal.

14. A data transmission circuit comprising:
    a count signal generator configured to be driven in response to an activation signal which is enabled during a drive control period to generate first and second count signals by performing counting operations under a control of a clock signal; and
    a signal converter configured to output first and second pull-up control signals for controlling a pull-up drive of a transmission data signal by buffering opposite logic levels to the first and second count signals and to output first and second pull-down control signals for controlling a pull-down drive of the transmission data signal by buffering the first and second count signals, wherein the drive control period may be set to a period when an impedance calibration test is being carried out.

15. The data transmission circuit of claim 14, wherein frequencies of the first and second count signals vary according to a frequency of the clock signal.

16. The data transmission circuit of claim 15, wherein the frequencies of the first and second count signals increase as the frequency of the clock signal increases.

17. The data transmission circuit of claim 16, wherein if the frequencies of the first and second count signals increase, the first and second pull-up control signals increase a pull-up drivability of the transmission data signal and the first and second pull-down control signals increase a pull-down drivability of the transmission data signal.

18. The data transmission circuit of claim 14, wherein the count signal generator includes:
   a first counter configured to receive the activation signal to output the first count signal generated in response to the clock signal; and
   a second counter configured to receive the activation signal to output the second count signal generated in response to the first count signal.

19. The data transmission circuit of claim 18, wherein the first count signal is obtained by dividing the frequency of the clock signal by two, and wherein the second count signal is obtained by dividing the frequency of the clock signal by four.

20. The data transmission circuit of claim 18, wherein the signal converter includes:
   a first buffer configured to buffer opposite logic-levels to the first and second count signals to generate the first and second pull-up control signals; and
   a second buffer configured to buffer opposite logic-levels to the first and second pull-up control signals to generate the first and second pull-down control signals.

\* \* \* \* \*